(12) United States Patent
Lee (10) Patent No.: US 11,715,706 B2
(45) Date of Patent: Aug. 1, 2023

(54) SEMICONDUCTOR CHIP, SEMICONDUCTOR DEVICE AND ELECTROSTATIC DISCHARGE PROTECTION METHOD FOR SEMICONDUCTOR DEVICE THEREOF

(71) Applicant: NANYA TECHNOLOGY CORPORATION, New Taipei (TW)

(72) Inventor: Chun-Lu Lee, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 134 days.

(21) Appl. No.: 17/382,751

(22) Filed: Jul. 22, 2021

(65) Prior Publication Data

US 2023/0028109 A1 Jan. 26, 2023

(51) Int. Cl.
| | |
|---|---|
| *H01L 23/60* | (2006.01) |
| *H01L 23/525* | (2006.01) |
| *H01L 25/00* | (2006.01) |
| *H01L 25/065* | (2023.01) |
| *H01L 27/02* | (2006.01) |

(52) U.S. Cl.
CPC .......... *H01L 23/60* (2013.01); *H01L 23/5256* (2013.01); *H01L 25/0657* (2013.01); *H01L 25/50* (2013.01); *H01L 27/0255* (2013.01)

(58) Field of Classification Search
CPC . H01L 23/60; H01L 23/5256; H01L 25/0657; H01L 25/50
See application file for complete search history.

(56) References Cited

U.S. PATENT DOCUMENTS

| | | | |
|---|---|---|---|
| 8,878,304 B2 | 11/2014 | Fang et al. | |
| 2005/0029596 A1* | 2/2005 | Rodov | H01L 29/1602 438/281 |
| 2012/0236444 A1 | 9/2012 | Srivastava et al. | |
| 2015/0188312 A1 | 7/2015 | Kwok | |
| 2018/0139826 A1* | 5/2018 | Cho | H01G 4/248 |
| 2020/0219828 A1* | 7/2020 | Liu | H01L 24/17 |

FOREIGN PATENT DOCUMENTS

| | | |
|---|---|---|
| TW | 201628160 A | 8/2016 |
| TW | 201840087 A | 11/2018 |
| TW | 202005041 A | 1/2020 |
| TW | 202119722 A | 5/2021 |

* cited by examiner

*Primary Examiner* — Thao P Le
(74) *Attorney, Agent, or Firm* — Muncy, Geissler, Olds & Lowe, P.C.

(57) ABSTRACT

The present application discloses a semiconductor chip, a semiconductor device and an electrostatic discharge (ESD) protection method for a semiconductor device. The semiconductor chip includes an electrical contact, an application circuit, and an ESD protection unit. The application circuit performs operations according to a one signal received by the electrical contact. The ESD protection unit is coupled to the electrical contact. The capacitance of the ESD protection unit is adjustable.

18 Claims, 11 Drawing Sheets

SEMICONDUCTOR CHIP, SEMICONDUCTOR DEVICE AND ELECTROSTATIC DISCHARGE PROTECTION METHOD FOR SEMICONDUCTOR DEVICE THEREOF

TECHNICAL FIELD

The present disclosure relates to a semiconductor chip, and more particularly, to a semiconductor chip including electrostatic discharge protection units of adjustable capacitance.

DISCUSSION OF THE BACKGROUND

Electrostatic discharge (ESD) occurs when two differently-charged objects contact with each other. For example, when a pad of a semiconductor chip contacts a charged object, such as human body or a circuit board, an ESD event would occur. In such case, a drastic discharge current will be induced on the pad of the semiconductor chip so as to discharge charges accumulated in the semiconductor chip or the charged object. To protect components in the semiconductor chip from being damaged by the drastic and intensive discharge current, ESD protection circuits are often added to pads of the semiconductor chip.

However, the ESD protection circuits often include capacitive elements, which may cause distortion to signals received by the pads. For example, a rise time and a fall time of a signal will be extended because the signal has to charge or discharge the capacitive elements. Furthermore, as signals have higher frequencies, it would be even more difficult to identify the data delivered by the signals. In addition, in a multi-chip device, such as a memory device including multiple stacked dynamic random access memory (DRAM) chips, the chips of different ranks may be coupled together for receiving the same signals and operating in parallel. In such case, those signals will have to charge or discharge capacitive elements in all of the chips that coupled together, thereby further deteriorate the quality of signals.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor chip including an electrical contact, an application circuit, and an electrostatic discharge (ESD) protection unit. The application circuit is configured to perform operations according to at least a signal received by the electrical contact. The ESD protection unit is coupled to the electrical contact. Capacitance of the ESD protection unit is adjustable.

In some embodiments, the first ESD protection unit comprises a first ESD protection element and a second ESD protection element. The first ESD protection element is coupled between the electrical contact and a voltage terminal, and has first capacitance. The second ESD protection element is coupled between the electrical contact and the ground, and has second capacitance. The voltage terminal is coupled to a ground or a power voltage.

In some embodiments, the first ESD protection unit further comprises a switch coupled in series with the second ESD protection element between the electrical contact and the voltage terminal. The semiconductor chip further comprises a control circuit configured to turn on or turn off the switch for adjusting capacitance of the ESD protection unit.

In some embodiments, the ESD protection unit further comprises a fuse coupled in series with the second ESD protection element between the electrical contact and the voltage terminal. The fuse is configured to be burned to decrease capacitance of the ESD protection unit.

In some embodiments, the ESD protection element comprises a diode.

Another aspect of the present disclosure provides a semiconductor device. The semiconductor device comprises a first semiconductor chip and a second semiconductor chip. The first semiconductor chip comprises a first electrical contact, a first application circuit, and a first electrostatic discharge (ESD) protection unit. The first application circuit is configured to perform operations according to at least a signal received by the first electrical contact. The first ESD protection unit is coupled to the first electrical contact. The second semiconductor chip comprises a second electrical contact, a second application circuit, and a second ESD protection unit. The second application circuit is configured to perform operations according to at least a signal received by the second electrical contact. The second ESD protection unit is coupled to the second electrical contact. The first electrical contact is coupled to the second electrical contact for receiving a same signal. Capacitance of the first ESD protection unit is adjustable, and capacitance of the second ESD protection unit is adjustable.

In some embodiments, the first ESD protection unit comprises a first ESD protection element and a second ESD protection element. The first ESD protection element is coupled between the first electrical contact and a voltage terminal, and has first capacitance. The second ESD protection element is coupled between the first electrical contact and the voltage terminal, and has second capacitance. The voltage terminal is coupled to a ground or a power voltage.

In some embodiments, the first ESD protection unit further comprises a switch coupled in series with the second ESD protection element between the first electrical contact and the voltage terminal. The first semiconductor chip further comprises a control circuit configured to turn on or turn off the switch for adjusting capacitance of the first ESD protection unit.

In some embodiments, the first ESD protection unit further comprises a fuse coupled in series with the second ESD protection element between the first electrical contact and the voltage terminal, and the fuse is configured to be burned to decrease capacitance of the first ESD protection unit.

In some embodiments, the first ESD protection element comprises a diode.

In some embodiments, the first application circuit of the first semiconductor chip and the second application circuit of the second semiconductor chip are dynamic random access memory (DRAM) circuits.

In some embodiments, the semiconductor device further comprises a substrate, wherein the first semiconductor chip is disposed on the substrate, and the second semiconductor chip is stacked on the first semiconductor chip.

In some embodiments, the semiconductor device further comprises a substrate, wherein the first semiconductor chip is disposed on a first surface of the substrate, and the second semiconductor chip is disposed on a second surface of the substrate.

In some embodiments, the semiconductor device further comprises a third electrical contact and a third ESD protection unit. The third electrical contact is configured to receive a first semiconductor chip selection signal, and the third ESD protection unit is coupled between the third electrical contact and a voltage terminal. Capacitance of the third ESD protection unit is not adjustable.

In some embodiments, the semiconductor device the second semiconductor chip further comprises a fourth electrical contact and a fourth ESD protection unit. The fourth electrical contact is configured to receive a second semiconductor chip selection signal different from the first semiconductor chip selection signal, and the fourth ESD protection unit is coupled between the fourth electrical contact and the voltage terminal. Capacitance of the fourth ESD protection unit is not adjustable.

Another aspect of the present disclosure provides an electrostatic discharge (ESD) protection method for a semiconductor device. The semiconductor device comprises a first semiconductor chip and a second semiconductor chip, the first semiconductor chip comprises a first electrical contact, and the second semiconductor chip comprises a second electrical contact. The method comprises forming a first ESD protection unit in the first semiconductor chip, wherein the first ESD protection unit is coupled to the first electrical contact, forming a second ESD protection unit in the second semiconductor chip, wherein the second ESD protection unit is coupled to the second electrical contact, coupling the first electrical contact to the second electrical contact, and adjusting capacitance of the first ESD protection unit and capacitance of the second ESD protection unit.

In some embodiments, the first ESD protection unit comprises a plurality of ESD protection elements coupled between the first electrical contact and a voltage terminal. The voltage terminal is coupled to a ground or a power voltage. Adjusting the capacitance of the first ESD protection unit and the capacitance of the second ESD protection unit comprises uncoupling at least one of the plurality of ESD protection elements from the first electrical contact or the voltage terminal.

In some embodiments, the semiconductor device further comprises at least one semiconductor chip having a same structure as the first semiconductor chip and comprising an electrical contact coupled to the first electrical contact of the first semiconductor chip. The method further comprises determining targeted capacitance of the first ESD protection unit and the second ESD protection unit according to a total quantity of semiconductor chips including the first semiconductor chip, the second semiconductor chip, and the at least one semiconductor chip in the semiconductor device.

In some embodiments, each of the first semiconductor chip and the second semiconductor chip comprises dynamic random access memory circuit.

In some embodiments, the semiconductor device further comprises a substrate, the first semiconductor chip is disposed on the substrate, and the second semiconductor chip is stacked on the first semiconductor chip.

Since the semiconductor chip, the semiconductor device, and the ESD protection method for the semiconductor device thereof can adjust capacitance of ESD protection units according to system requirements, signal distortion caused by capacitance of the ESD protection units] can be mitigated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and a semiconductor device are all included in the category of the semiconductor device. Specifically, semiconductor devices of embodiments of the present disclosure may be dynamic random-access memory devices.

Note that, in the description of the present disclosure, above (or up) corresponds to the direction of the arrow of the direction Z, and below (or down) corresponds to the opposite direction of the arrow of the direction Z.

Figure 1:
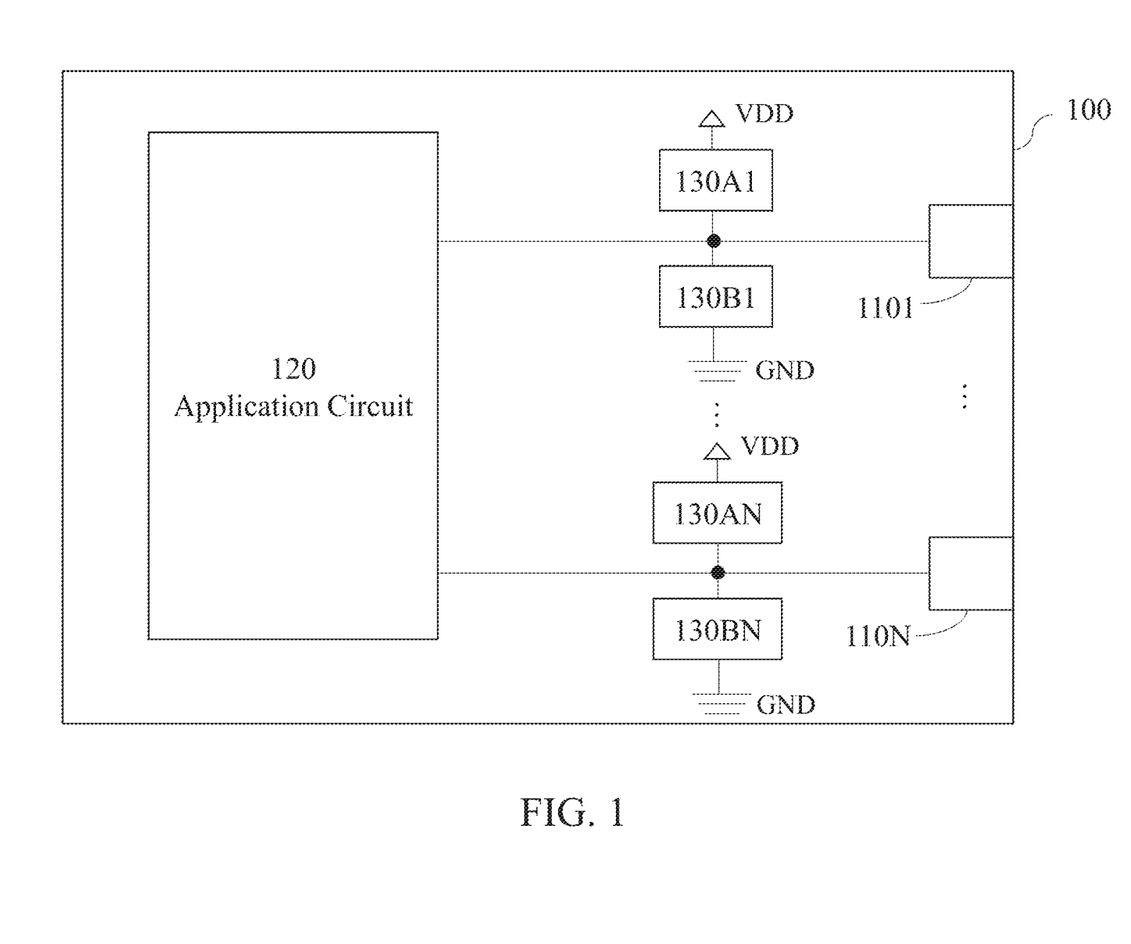
FIG. 1 shows a semiconductor chip according to one embodiment of the present disclosure.

FIG. 1 shows a semiconductor chip 100 according to one embodiment of the present disclosure. The semiconductor chip 100 includes electrical contacts 110₁ to 110N, an application circuit 120, and ESD protection units 130A1 to 130AN and 130B1 to 130BN, where N is a positive integer, for example but not limited to 4, 6 or 8. In some embodiments, N can also be 1. In such case, the semiconductor chip 100 would include one electrical contact 110₁ and ESD protection units 130A1 and 130B1.

Each of the electrical contacts 110₁ to 110N can receive a signal. In some embodiments, the electrical contacts 110₁ to 110N can be pins, solder pads, micro bumps or other types of contact body for external connection. The application circuit 120 can perform operations according to signals received by the electrical contacts 110₁ to 110N. For example, the application circuit 120 can be a dynamic random access memory (DRAM) circuit. In such case, some of the electrical contacts 110₁ to 110N would receive read/write commands, and addresses or data corresponding to the commands, and the application circuit 120 would perform read operations or write operations according to the commands, and transmit the requested data through some of the electrical contacts 110₁ to 110N.

Since the electrical contacts 110₁ to 110N are used for external connection, ESD protection units 130A1 to 130AN and 130B1 to 130BN are coupled to the electrical contacts 110₁ to 110N for providing discharge paths at the electrical contacts 110₁ to 110N, thereby preventing the discharge currents from damaging the application circuit 120. As shown in FIG. 1, each of the ESD protection units 130A1 to 130AN and 130B1 to 130BN is coupled to a corresponding electrical contact of the electrical contacts 110₁ to 110N. For example, the ESD protection unit 130A1 is coupled to the electrical contact 110₁, and the ESD protection unit 130AN is coupled to the electrical contact 110N. Furthermore, in the present embodiment, capacitance of the ESD protection units 130A1 to 130AN and 130B1 to 130BN is adjustable. That is, capacitance of each of the ESD protection units 130A1 to 130AN and 130B1 to 130BN can be adjusted according to system requirements.

Figure 2:
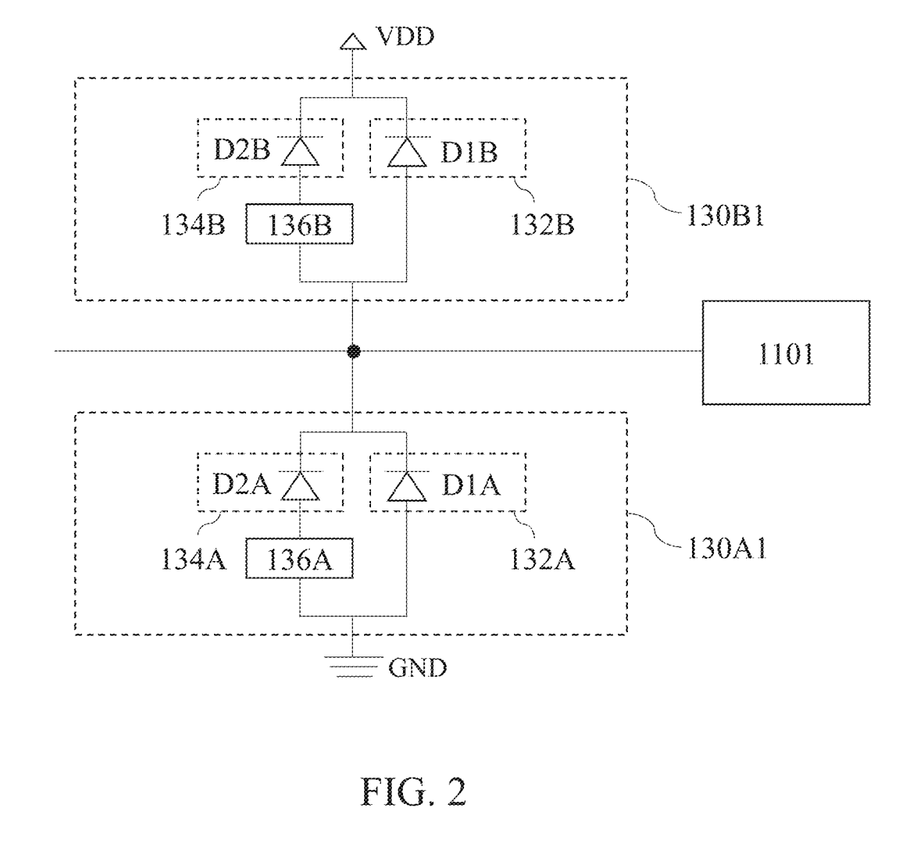
FIG. 2 shows the ESD protection units in FIG. 1 according to one embodiment of the present disclosure.

FIG. 2 shows the ESD protection units 130A1 and 130B1 according to one embodiment of the present disclosure. In the present embodiments, the ESD protection units 130A1 to 130AN and 130B1 to 130BN can have the same structures. As shown in FIG. 2, the ESD protection unit 130A1 includes a first ESD protection element 132A and a second ESD protection element 134A.

The first ESD protection element 132A is coupled between the first electrical contact 110₁ and the ground GND, and the second ESD protection element 134A is also coupled between the first electrical contact 110₁ and the ground GND. The first ESD protection element 132A has first capacitance, and the second ESD protection element 134A has second capacitance.

Since the first ESD protection element 132A and the second ESD protection element 134A are coupled in parallel between the first electrical contact 110₁ and the ground GND, the equivalent capacitance of the ESD protection unit 130A1 is substantially the sum of the first capacitance of the first ESD protection element 132A and the second capacitance of the second ESD protection element 134A. In the present embodiment, to allow the ESD protection unit 130A1 to have adjustable capacitance, the ESD protection unit 130A1 further includes a fuse 136A coupled in series with the second ESD protection element 134A between the first electrical contact 110₁ and the ground GND. In such case, the fuse 136A can be burned out to uncouple the second ESD protection element 134A from the first electrical contact 110₁ or the ground GND, so the second ESD protection element 134A will no longer be able to provide discharge paths between the first electrical contact 110₁ and the ground GND, and the capacitance of the first ESD protection unit 130A1 is decreased. That is, the capacitance of the first ESD protection unit 130A1 can be adjusted by burning out the fuse 136A according to system requirements. In some embodiments, the semiconductor chip 100 may further include other circuits or components (not shown in FIG. 2) for controlling the fuse 136A so that the fuse 136A can be burned without damaging other components in the semiconductor chip 100.

As shown in FIG. 2, the first ESD protection element 132A includes a diode D1A. The diode D1A has an anode coupled to the ground GND, and a cathode coupled to the first electrical contact 110₁. Similarly, the second ESD protection element 134A also includes a diode D2A having an anode coupled to the ground GND, and a cathode coupled to the first electrical contact 1101. As a result, when the voltage at the first electrical contact 1101 is raised drastically during the ESD event, the diodes D1A and/or D2A can be broken down and thus provide discharging paths for ESD currents. In some embodiments, the diodes D1A and D2A may have the same sizes. In such case, the first capacitance of the first ESD protection element 132A can be substantially equal to the second capacitance of the second ESD protection element 134A. However, the present disclosure is not limited thereto. In some other embodiments, the diodes D1A and D2A may have different sizes, and the first capacitance of the first ESD protection element 132A can be different from the second capacitance of the second ESD protection element 134A. Furthermore, in some other embodiments, the first ESD protection element 132A and the second ESD protection element 134A may include diodes, capacitors, resistors, and/or transistors.

Similarly, the ESD protection unit 130B1 includes a first ESD protection element 132B, a second ESD protection element 134B, and a fuse 136B. However, the ESD protection unit 130B1 can be coupled between the first electrical contact 1101 and a power voltage VDD. That is, the ESD protection unit 130B1 can be used to provide another discharge path to the power voltage VDD for ESD protection. In such case, the diode D1B of the first ESD protection element 132B has an anode coupled to the first electrical contact 1101, and a cathode coupled to the power voltage VDD. Similarly, the diode D2B of the second ESD protection element 134B has an anode coupled to the first electrical contact 1101, and a cathode coupled to the power voltage VDD. As a result, if the voltage at the first electrical contact is pulled down drastically during the ESD event, the diodes D1B and/or D2B will be broken down and thus provide discharging paths for ESD currents. That is, the ESD protection units 130A1 to 130AN can be used to provide discharging path to the ground GND, and the ESD protection units 130B1 to 130BN can be used to provide discharging path to the power voltage VDD. However, the present disclosure is not limited thereto. In some other embodiments, the semiconductor chip 100 may omit some of the ESD protection units 130A1 to 130AN and 130B1 to 130BN according to system requirements. For example, in some embodiments, the semiconductor chip 100 may include the ESD protection units 130A1 to 130AN and omit the ESD protection units 130B1 to 130BN if the ESD events on the power voltage VDD can be ignored.

Figure 3:
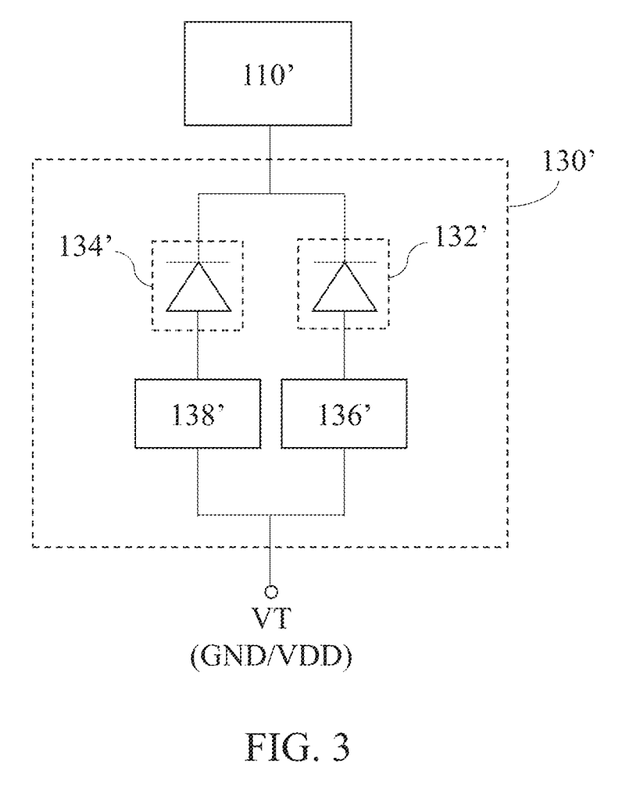
FIG. 3 shows an ESD protection unit according to another embodiment of the present disclosure.

FIG. 3 shows an ESD protection unit 130' according to one embodiment of the present disclosure. In some embodiments, the ESD protection unit 130' can be used to replace the ESD protection units 130A1 to 130AN and 130B1 to 130BN in the semiconductor chip 100. As shown in FIG. 3, the ESD protection unit 130' include a first ESD protection element 132', a second ESD protection element 134', a first fuse 136' and a second fuse 138'. The first fuse 136' is coupled in series with the first ESD protection element 132' between an electrical contact 110' and a voltage terminal VT, and the second fuse 138' is coupled in series with the second ESD protection element 134' between an electrical contact 110' and the voltage terminal VT. The voltage terminal VT can be coupled to the ground GND or the power voltage VDD. In addition, the capacitance of the first ESD protection element 132' and the capacitance of the second ESD protection element 134' can be different. In the case that the each of the ESD protection units 130A1 to 130AN and 130B1 to 130BN is replaced by the ESD protection unit 130', the manufacturer may decide to burn out the first fuse 136' or the second fuse 138' for providing the ESD protection with the desired capacitance according to customer's requirements before shipping the semiconductor chip 100 or before the semiconductor chip 100 is installed. In some embodiments, the ESD protection units 130' may further include more ESD protection elements and fuses so as to provide more options of capacitance.

Figure 4:
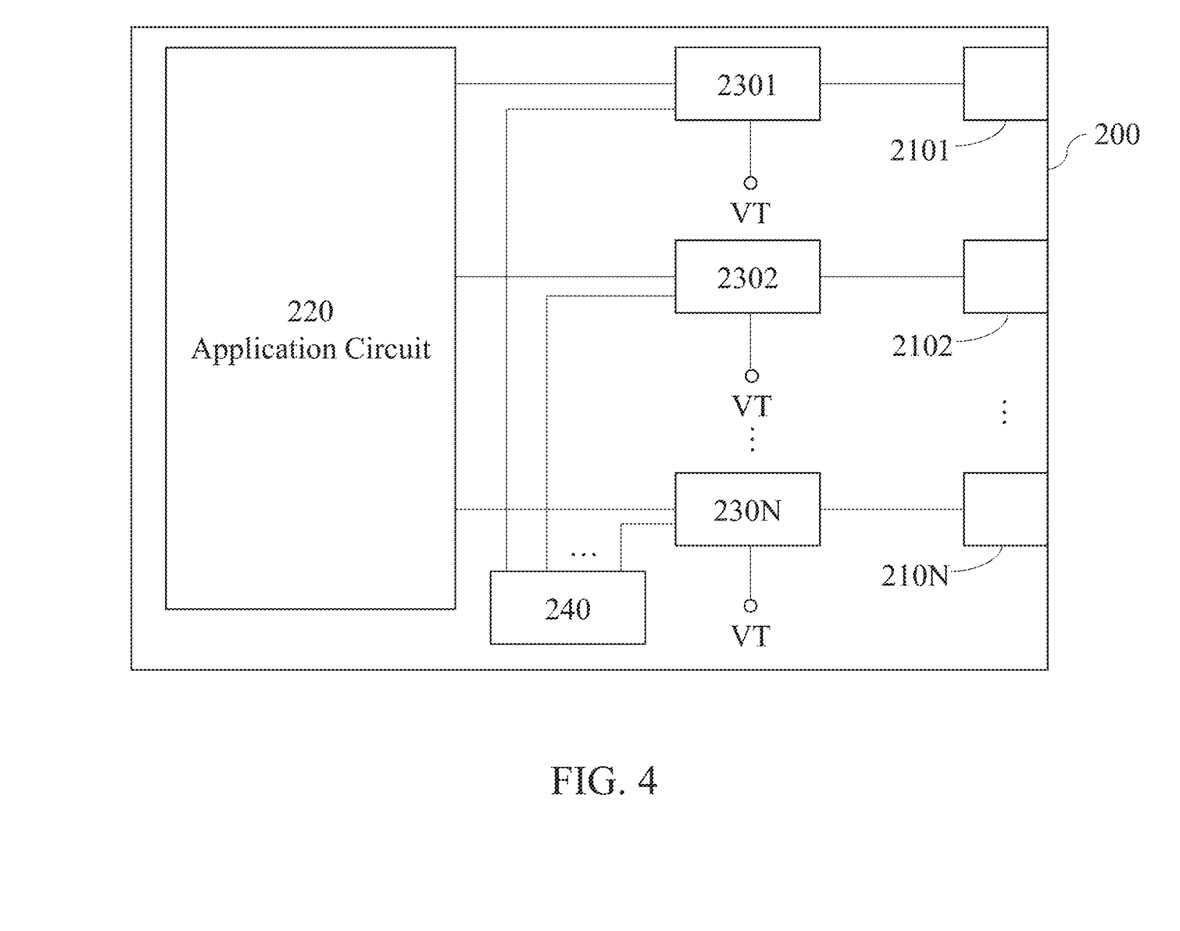
FIG. 4 shows a semiconductor chip according to another embodiment of the present disclosure.
Figure 5:
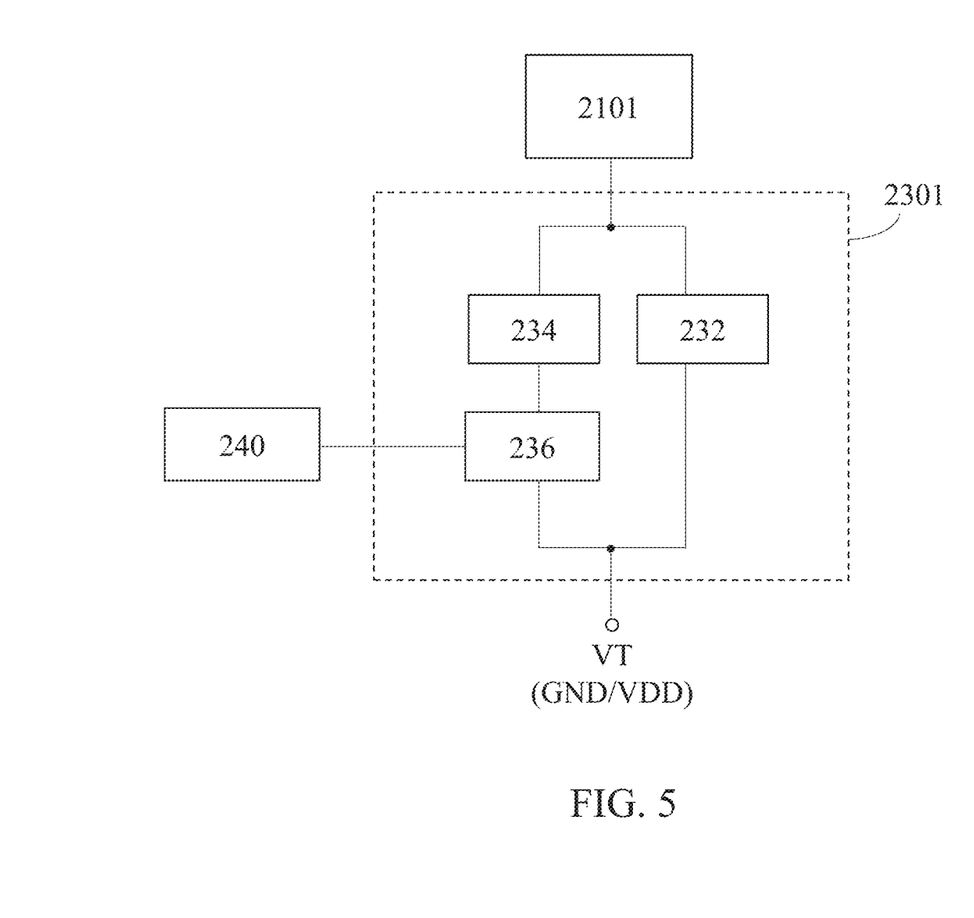
FIG. 5 shows the ESD protection unit in FIG. 4 according to one embodiment of the present disclosure.

FIG. 4 shows a semiconductor chip 200 according to another embodiment of the present disclosure. The semiconductor chips 200 includes electrical contacts 2101 to 210N, an application circuit 220, ESD protection units 2301 to 230N, and a control circuit 240. In the present embodiment, the ESD protection unit 2301 to 230N may have different structures from those of the ESD protection unit 130A1 to 130AN and 130B1 to 130BN. FIG. 5 shows the ESD protection unit 2301 according to one embodiment of the present disclosure. In the present embodiments, the ESD protection units 2301 to 230N can have the same structures. As shown in FIG. 5, the ESD protection unit 2301 includes a first ESD protection element 232, a second ESD protection element 234, and a switch 236.

The first ESD protection element 232 is coupled between the first electrical contact 2101 and the voltage terminal VT, and the second ESD protection element 234 and the switch 236 are coupled in series between the first electrical contact 2101 and the voltage terminal VT. The voltage terminal VT can be coupled to the ground GND or the power voltage VDD. In such case, the control circuit 240 can turn on or turn off the switch 236 to adjust the capacitance of the first ESD protection unit 2301. Furthermore, the first capacitance of the first ESD protection element 232 can be the same as or different from the second capacitance of the second ESD protection element 234. In addition, in some embodiments, the ESD protection unit 2301 may further include more ESD protection elements and more switches for providing more options of capacitance.

Figure 6:
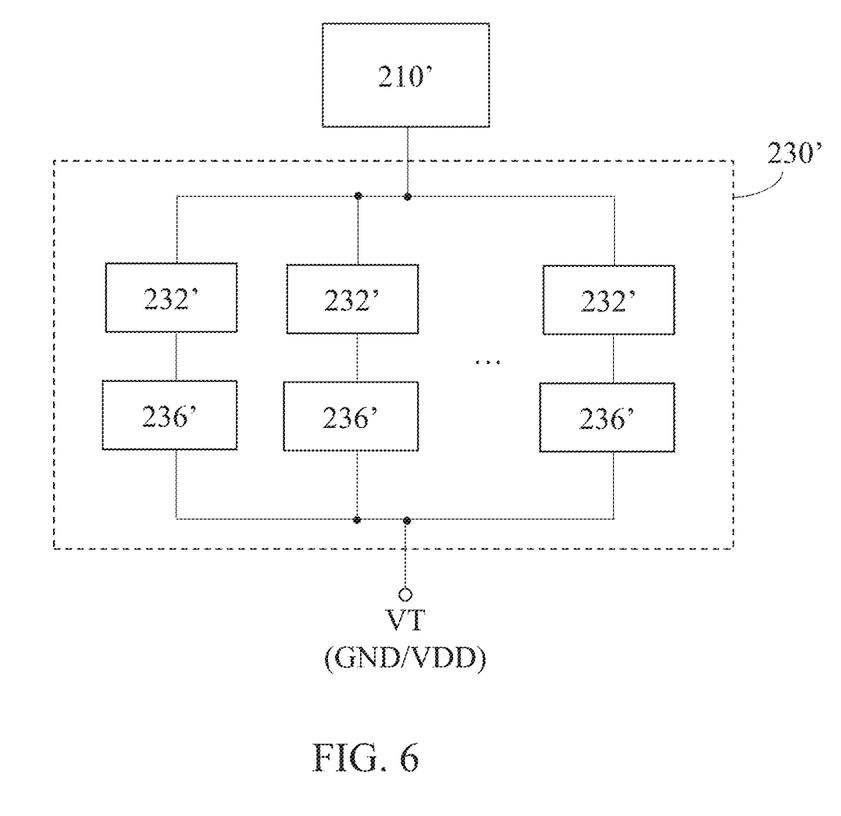
FIG. 6 shows an ESD protection unit according to another embodiment of the present disclosure.

FIG. 6 shows an ESD protection unit 230' according to another embodiment of the present disclosure. In the present embodiments, the ESD protection unit 230' can be used to implement the ESD protection units 2301 to 230N of the semiconductor chip 200. As shown in FIG. 6, the ESD protection unit 230' includes a plurality of ESD protection elements 232', and a plurality of switches 236'. Each of the ESD protection element 232' is coupled in series with a switch 236' between an electrical contact 210' and the ground. In such case, by turning on different quantity of switches 236' of the ESD protection unit 230', the ESD protection unit 230' can be adjusted to have different capacitance. That is, by including more ESD protection elements 232' and switches 236', it allows the ESD protection unit 230' to provide more options of different capacitances.

Figure 7:
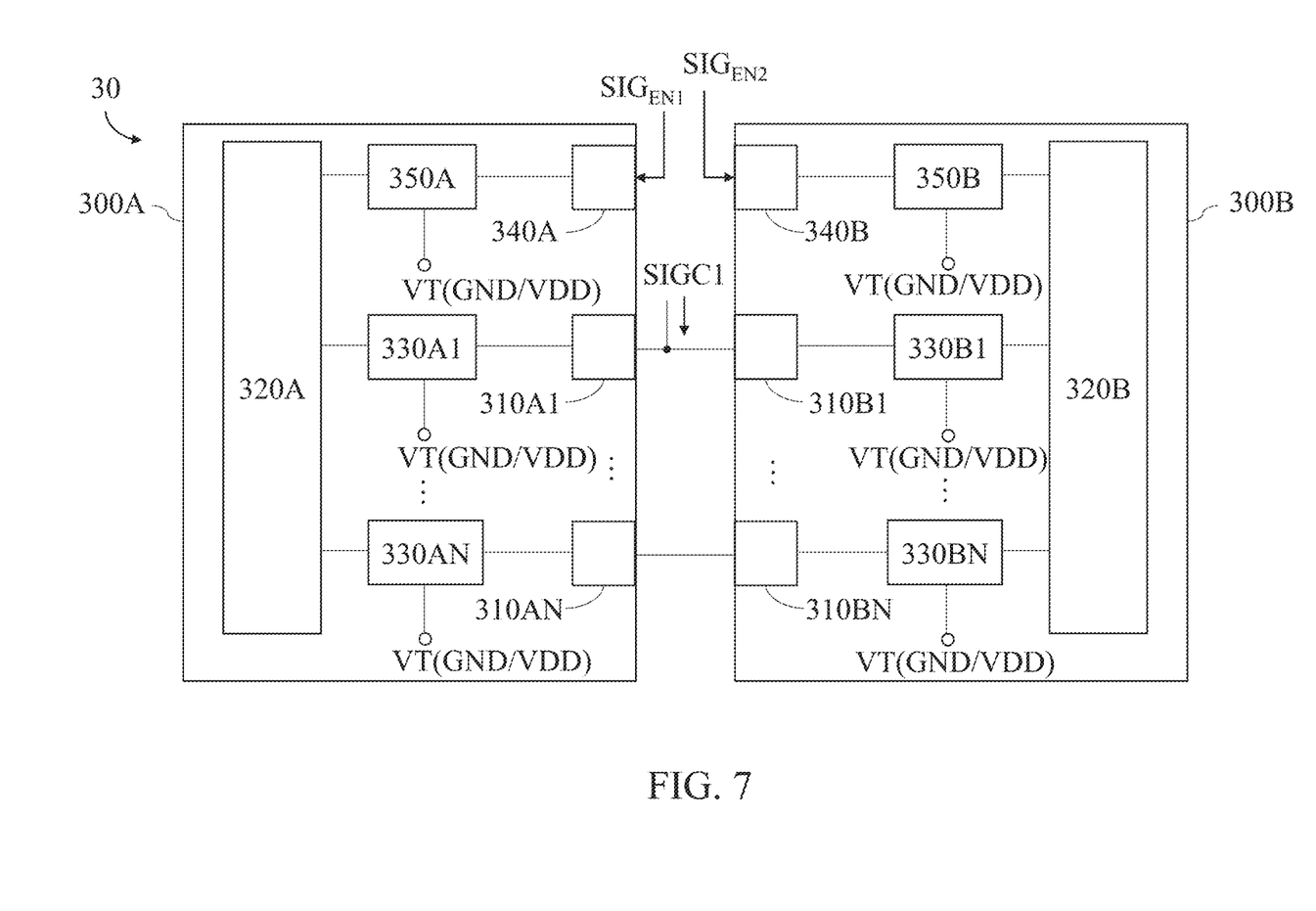
FIG. 7 shows a semiconductor device according to one embodiment of the present disclosure.

FIG. 7 shows a semiconductor device 30 according to one embodiment of the present disclosure. The semiconductor device 30 includes a first semiconductor chip 300A and a second semiconductor chip 300B. In the present embodiment, the semiconductor chips 300A and 300B can have the same structure. For example, as shown in FIG. 7, the first semiconductor chip 300A includes first electrical contacts 310A1 to 310AN, a first application circuit 320A, and first ESD protection units 330A1 to 330AN. Also, the second semiconductor chip 300B includes second electrical contacts 310B1 to 310BN, a second application circuit 320B, and second ESD protection units 330B1 to 330BN. Furthermore, each of the first ESD protection units 330A1 to 330AN can be coupled between a first electrical contact of the first electrical contacts 310A1 to 310AN and the voltage terminal VT, and each of the second ESD protection units 330B1 to 330BN can be coupled between a second electrical contact of the second electrical contacts 310B1 to 310BN and the voltage terminal VT, where the voltage terminals VT can be coupled to the ground GND or the power voltage VDD according to the system requirements. In some other embodiments, to provide discharging paths to both the ground GND and the power voltage VDD, the first semiconductor chip 300A and the second semiconductor chip 300B may include more ESD protection units so that each of the electrical contacts 310A1 to 310AN and 310B1 to 310B1 can be protected by two ESD protection units, one coupled to the ground GND and another coupled the power voltage VDD, as shown in FIG. 1.

In the present embodiment, the first ESD protection units 330A1 to 330AN and the second ESD protection units 330B1 to 330BN can have the same structure as the ESD protection unit 130A1 or 130B1 shown in FIG. 2 so the capacitance of each of the first ESD protection units 330A1 to 330AN is adjustable, and the capacitance of each of the second ESD protection units 330B1 to 330BN is adjustable.

Furthermore, as shown in FIG. 7, each of the first electrical contacts 310A1 to 310AN is coupled to a corresponding second electrical contact of the second electrical contacts 310B1 to 310BN for receiving a same signal. For example, the semiconductor device 30 can be a memory system, and the first application circuit 320A and the second application circuit 320B can be DRAM circuits that are combined to provide a wider bandwidth and a larger memory space for the semiconductor device 30. In such case, the first electrical contacts 310A1 to 310AN and the second electrical contacts 310B1 to 310BN can be used to receive the same signals. For example, the first electrical contact 310A1 and the second electrical contact 310B1 can be coupled together for receiving a signal SIGC1. However, since the first ESD protection unit 330A1 and the second ESD protection unit 330B1 are capacitive, the signal SIGC1 needs to charge the equivalent capacitors or the parasitic capacitors of the first ESD protection unit 330A1 and the second ESD protection unit 330B1 before the actual voltage of the signal SIGC1 can be sensed by the first application circuit 320A and the second application circuit 320B. Therefore, the signal SIGC1 is distorted due to the capacitance of the first ESD protection unit 330A1 and the second ESD protection unit 330B1.

To mitigate the distortion of the signal SIGC1, the capacitance of the first ESD protection unit 330A1 and the second ESD protection unit 330B1 can be adjusted. For example, the first ESD protection unit 330A1 and the second ESD protection unit 330B1 can have the same structure as the structure of the ESD protection unit 130A1 shown in FIG. 2. In such case, the manufacturer can burn out one of fuses in the first ESD protection unit 330A1 and one of fuses in the second ESD protection unit 330B1, so the capacitance of each of the first ESD protection unit 330A1 and the second ESD protection unit 330B1 can be reduced. Furthermore, since the first electrical contact 310A1 is coupled to the second electrical contact 310B1, the first ESD protection unit 330A1 and the second ESD protection unit 330B1 can both be used to provide discharging paths during ESD events. Therefore, even though some of fuses in the first ESD protection unit 330A1 and the second ESD protection unit 330B1 are burned out, the remaining ESD protection elements in the first ESD protection unit 330A1 and the second ESD protection unit 330B1 can still provide sufficient protection to the first semiconductor chip 300A and the second semiconductor chip 300B. However, the present disclosure does not limit to implement the first ESD protection units 330A1 to 330AN and the second ESD protection units 330B1 to 330BN with the ESD protection unit 130A1 shown in FIG. 2. In some other embodiments, the ESD protection unit 130' shown in FIG. 3, the ESD protection unit 230I shown in FIG. 5, or the ESD protection unit 230' shown in FIG. 6 can be adopted to implement the first ESD protection units 330A1 to 330AN and the second ESD protection units 330B1 to 330BN according to system requirements.

Figure 8:
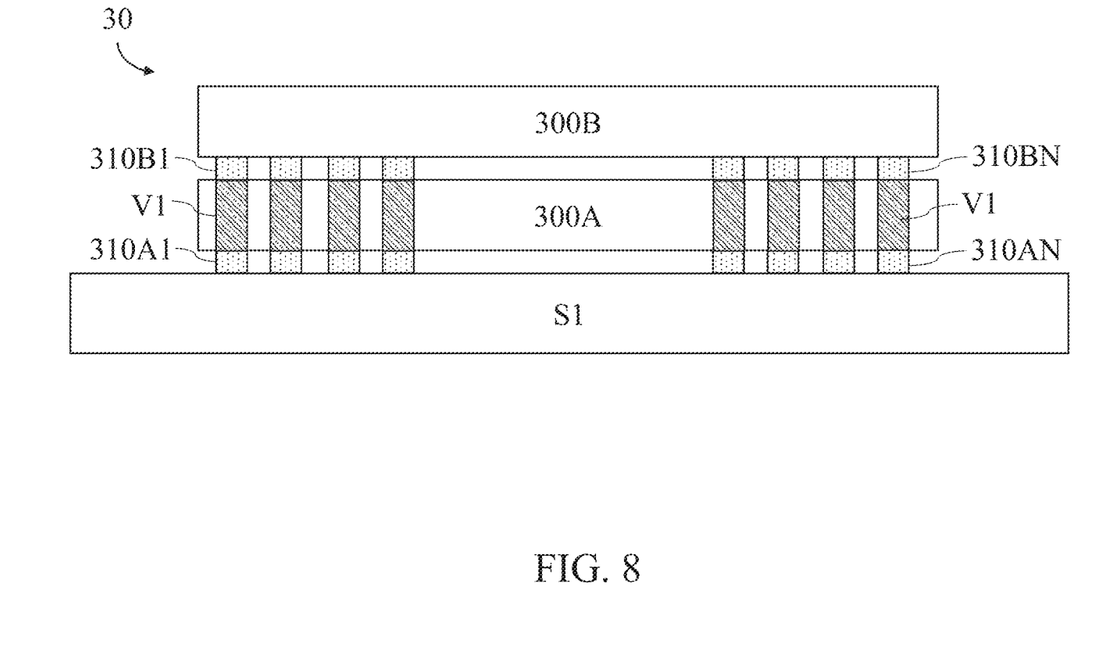
FIG. 8 shows a structure of the semiconductor device in FIG. 7 according to one embodiment.

FIG. 8 shows a structure of the semiconductor device 30 according to one embodiment. As shown in FIG. 8, the semiconductor device 30 further includes a substrate S1. The first semiconductor chip 300A is disposed on the substrate S1, and the second semiconductor chip 300B is stacked on the first semiconductor chip 300A. In the present embodiments, each of the second electrical contacts 310B1 to 310BN can be coupled to a corresponding one of the first electrical contacts 310A1 to 310AN by a through silicon via (TSV) V1. However, the present disclosure is not limited thereto. For example, in some other embodiments, the second semiconductor chip 300B may be stacked on the first semiconductor chip 300A without covering the first electrical contacts 310A1 to 310AN so the second electrical contacts 310B1 to 310BN can be coupled to the first electrical contacts 310A1 to 310AN by wiring bonding. However, the present disclosure does not limit the first semiconductor chip 300A and the second semiconductor chip 300B to be stacked.

Figure 9:
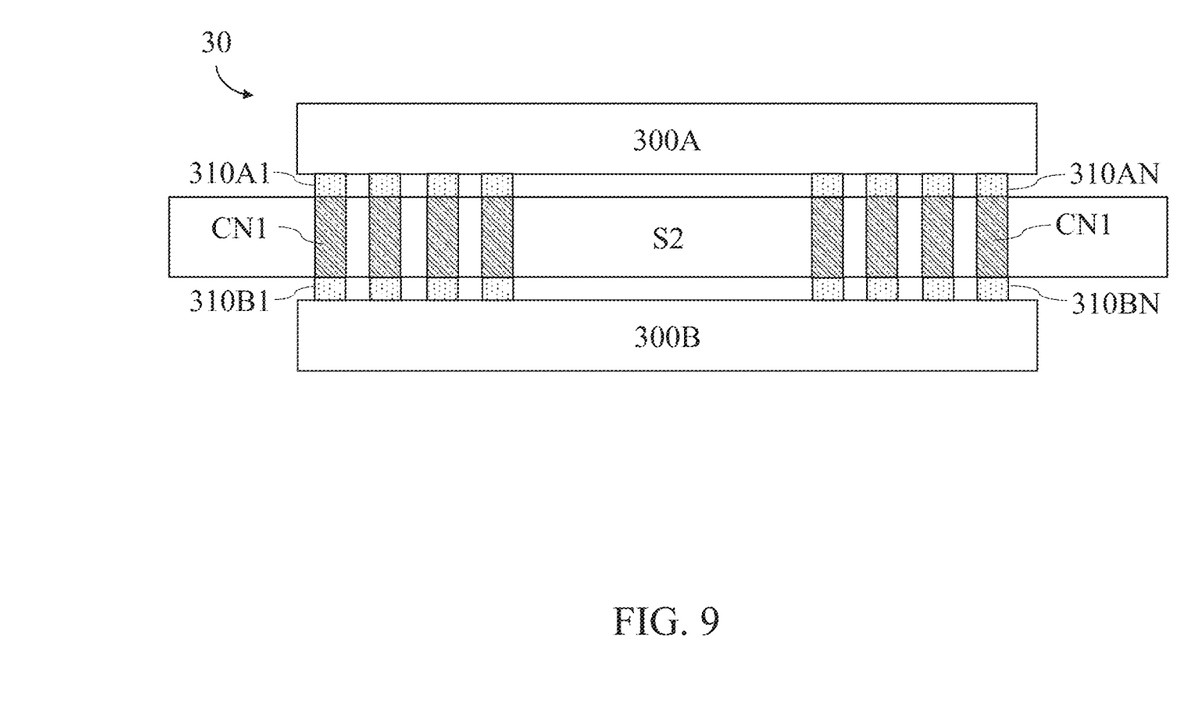
FIG. 9 shows a structure of the semiconductor device in FIG. 7 according to another embodiment.

FIG. 9 shows a structure of the semiconductor device 30 according to another embodiment. As shown in FIG. 9, the first semiconductor chip 300A is disposed on a first surface A1 of the substrate S2, and the second semiconductor chip 300B is disposed on a second surface A2 of the substrate S2. That is, the first semiconductor chip 300A and the second semiconductor chip 300B can be disposed in a back-to-back manner. In such case, the second electrical contacts 310B1 to 310BN can be coupled to the first electrical contacts 310A1 to 310AN by conductive structures CN1 of the substrate S2.

In some embodiments, not all the electrical contacts of the first semiconductor chip 300A are coupled to the electrical contacts of the second semiconductor chip 300B. For example, as shown in FIG. 7, the first semiconductor chip 300A further includes an electrical contact 340A and an ESD protection unit 350A, and the second semiconductor chip 300B further includes an electrical contact 340B and an ESD protection unit 350B. For example, the first semiconductor chip 300A and the second semiconductor chip 300B can be in different ranks. In such case, the electrical contact 340A can be used to receive a first semiconductor chip selection signal $SIG_{EN1}$, and the electrical contact 340B can be used to receive a second semiconductor chip selection signal $SIG_{EN2}$. That is, the electrical contact 340A and the electrical contact 340B are coupled to different signal sources for receiving different signals. Therefore, the first semiconductor chip 300A and the second semiconductor chip 300B and be enabled according to the first semiconductor chip selection signal $SIG_{EN1}$ and the second semiconductor chip selection signal $SIG_{EN2}$ respectively and independently. In such case, since each of the chip selection signals $SIG_{EN1}$ and $SIG_{EN2}$ needs only to charge the capacitance of the ESD protection unit 350A or the capacitance of the ESD protection unit 350B, distortion of the chip selection signals $SIG_{EN1}$ and $SIG_{EN2}$ caused by the ESD protection unit 350A or the capacitance of the ESD protection unit 350B is rather predictable and acceptable. Therefore, in the present embodiment, capacitance of the ESD protection unit 350A can be fixed and is not adjustable. Similarly, capacitance of the ESD protection unit 350B can be fixed and is not adjustable.

Figure 10:
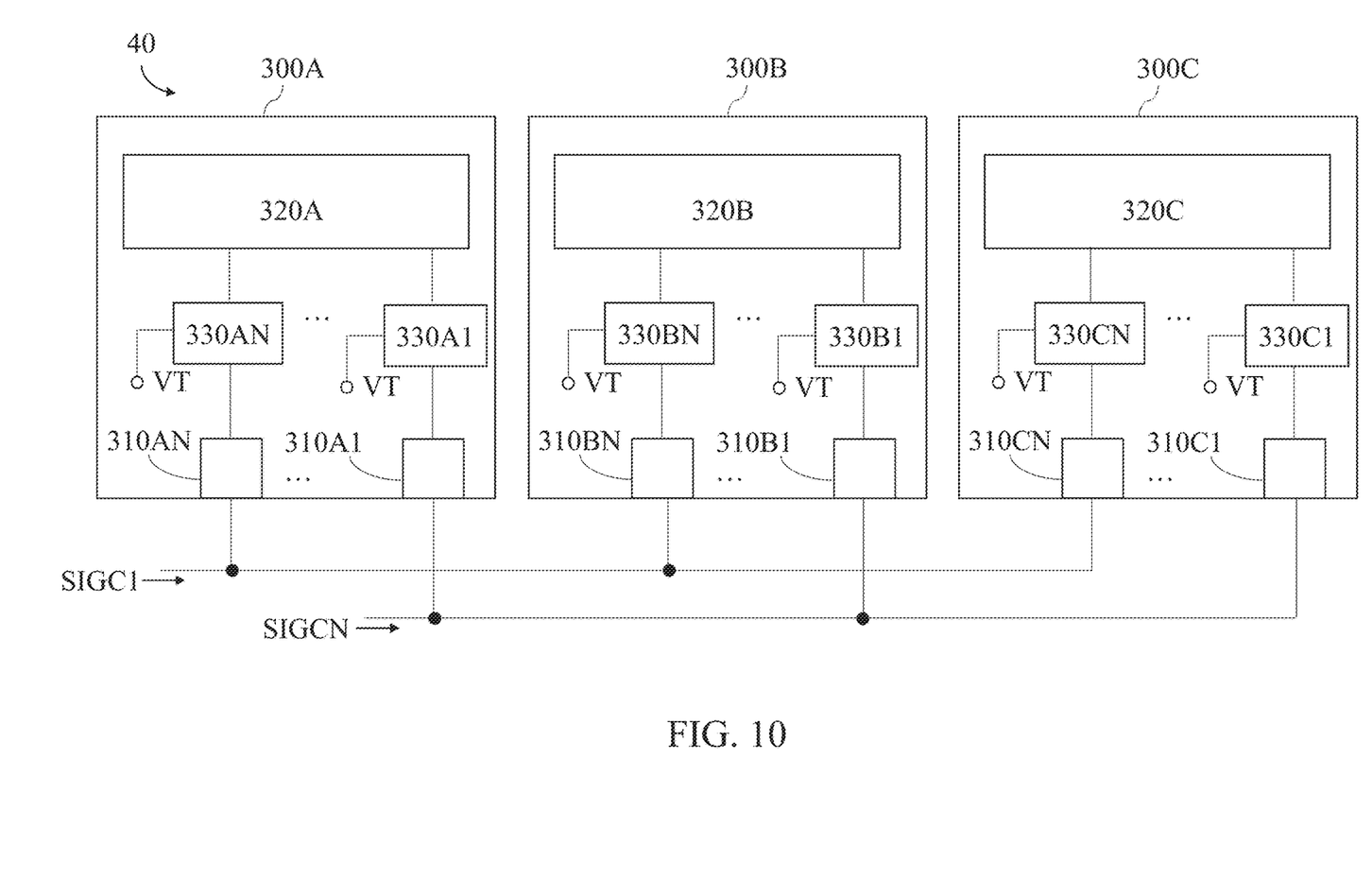
FIG. 10 shows a semiconductor device according to another embodiment of the present disclosure.

In some embodiments, the semiconductor device 30 may further include even more semiconductor chips to further increase the memory space and/or the data bandwidth. FIG. 10 shows a semiconductor device 40 according to another embodiment of the present disclosure. The semiconductor device 40 and the semiconductor device 30 have similar structures and can be operated according to similar principles. However, the semiconductor device 40 further includes a third semiconductor chip 300C, which has the same structure as those of the semiconductor chips 300A and 300B. In such case, if a signal is transmitted to the three semiconductor chips 300A, 300B, and 300C, then such signal will have to charge the equivalent capacitors or the parasitic capacitors of the ESD protection units of the three semiconductor chips 300A, 300B, and 300C before the actual voltage of such signal can be sensed by the application circuits 320A, 320B, and 320C of the three semiconductor chips 300A, 300B, and 300C.

For example, as shown in FIG. 10, the electrical contacts 310A1, 310B1, and 310C1 can be coupled together for receiving the same signal SIGC1, and the electrical contacts 310AN, 310BN, and 310CN can be coupled together for receiving the same signal SIGCN In such case, the signal SIGC1 will be distorted due to the capacitance of the ESD protection units 330A1, 330B1, and 330C1. To prevent the signals from being distorted by the ESD protection units 330A1, 330B1, and 330C1 coupled to the electrical contacts 310A1, 310B1, and 310C1, the capacitance of the ESD protection units 330A 1, 330B1, and 330C1 can be adjusted. For example, if the ESD protection unit 230' shown in FIG. 6 is adopted to implement the ESD protection units 330A1, 330B1, and 330C1, then for each of the ESD protection units 330A1, 330B1, and 330C1, two of the plurality of switches 236' can be turned off to reduce the capacitance. However, in some embodiments, if the ESD protection unit 230' shown in FIG. 6 is adopted to implement the ESD protection units 330A1 and 330B1 in the semiconductor device 30, one, instead of two, of the plurality of switches 236' may be turned off. That is, the capacitance of the ESD protection units 230' can be adjusted according to the system requirements, for example, the quantity of the semiconductor chips that are coupled together.

Figure 11:
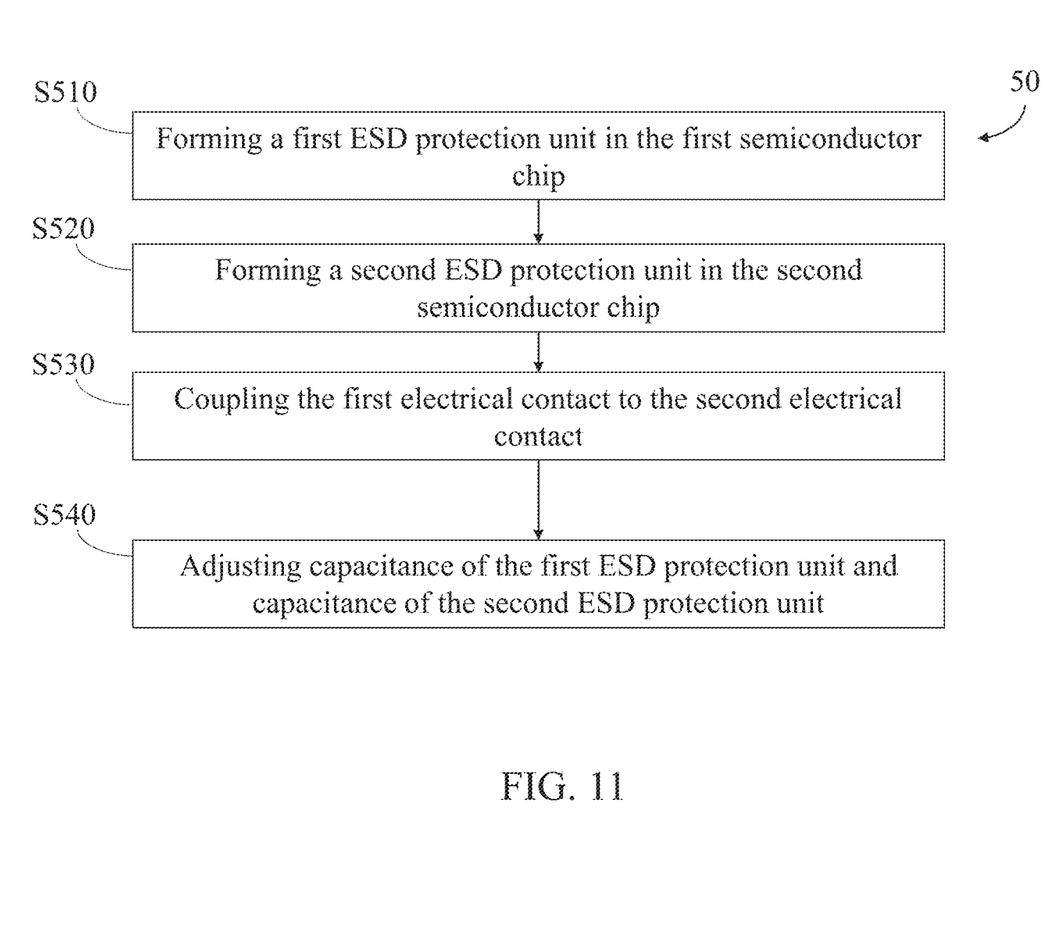
FIG. 11 shows a flow chart of an ESD protection method for the semiconductor device.

FIG. 11 shows a flow chart of an ESD protection method 50 for the semiconductor device 30. The method 50 includes steps S510 to S540 but not limited by the order below.

S510: form the first ESD protection units 330A1 to 330AN in the first semiconductor 300A;

S520: form the second ESD protection units 330B1 to 330BN in the second semiconductor 300B;

S530: couple each of the first electrical contacts 310A1 to 310AN to a corresponding second electrical contact of the second electrical contacts 310B1 to 310BN; and S540: adjust capacitance of the first ESD protection units 330A1 to 330AN and capacitance of each of the second ESD protection units 330B1 to 330BN.

In steps S510 and S520, the ESD protection unit 130A1 shown in FIG. 2, the ESD protection unit 130' shown in FIG. 3, the ESD protection unit 2301 shown in FIG. 5, or the ESD protection unit 230' shown in FIG. 6 can be used to implement each of the first ESD protection units 330A1 to 330AN and each of the second ESD protection units 330B1 to 330BN.

In the present embodiment, the first electrical contacts 310A1 to 310AN can be coupled to the second electrical contacts 310B1 to 310BN correspondingly to receive the same signals in step S530, and then the capacitance of the first ESD protection units 330A1 to 330AN and the capacitance of each of the second ESD protection units 330B1 to 330BN can be adjusted in step S540. However, in some embodiments, step S540 can be performed before step S530. For example, if the manufacturer or the user has already known that there will be two semiconductor chips 300A and 300B in the semiconductor device 30 in an early stage, then the manufacturer or the user may adjust the capacitance of the first ESD protection units 330A1 to 330AN and capacitance of each of the second ESD protection units 330B1 to 330BN by turning off some of switches or burning out some of fuses in the ESD protection units 330A1 to 330AN and 330B1 to 330BN according to the design of the ESD protection units 330A1 to 330AN and 330B1 to 330BN. For example, at least one of the ESD protection elements in the ESD protection unit 330A1 may be uncoupled from the first electrical contact 310A or the voltage terminal VT, thereby reducing the capacitance of the ESD protection unit 330A1. Afterwards, the semiconductor chips 300A and 300B can be installed to the substrate S1 and the electrical contacts 310A1 to 310AN and 310B1 to 310BN can be coupled accordingly.

Furthermore, in some embodiments, the targeted capacitance of the ESD protection units 330A 1 to 330AN and 330B1 to 330BN can be determined according to a total quantity of semiconductor chips in the semiconductor device 30. For example, the semiconductor device 30 includes two semiconductor chips 300A and 300B as shown in FIG. 7 while the semiconductor device 40 includes three semiconductor chips 300A, 300B, and 300C as shown in FIG. 10. In such cases, the targeted capacitance of the ESD protection units in the three semiconductor chips 300A, 300B, and 300C of the semiconductor device 40 may be smaller than the targeted capacitance of the ESD protection units in the three semiconductor chips 300A and 300B of the semiconductor device 30. That is, the capacitance of the ESD protection units can be adjusted according to the system requirements, for example, the quantity of the semiconductor chips that are coupled together.

In summary, the semiconductor chip, the semiconductor device, and the ESD protection method for the semiconductor device thereof can adjust capacitance of ESD protection units according to system requirements. Therefore, when multiple semiconductor chips are stacked or coupled to together for receiving the same signals simultaneously, the signal distortion caused by the capacitance of the ESD protection units of those semiconductor chips can be mitigated, thereby shortening the rise time and the fall time of the signals and improving the transmission quality of the signals.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor chip, comprising:
an electrical contact;
an application circuit configured to perform operations according to at least a signal received by the electrical contact; and
an electrostatic discharge (ESD) protection unit coupled to the electrical contact;
wherein capacitance of the ESD protection unit is adjustable;
wherein the ESD protection unit comprises:
a first ESD protection element coupled between the electrical contact and a voltage terminal, and having first capacitance;
a second ESD protection element coupled between the electrical contact and the voltage terminal, and having second capacitance;
wherein the voltage terminal is coupled to a ground or a power voltage;
wherein:
the ESD protection unit further comprises a switch coupled in series with the second ESD protection element between the electrical contact and the voltage terminal; and
the semiconductor chip further comprises a control circuit configured to turn on or turn off the switch for adjusting capacitance of the ESD protection unit.

2. The semiconductor chip of claim 1, wherein:
the ESD protection unit further comprises a fuse coupled in series with the second ESD protection element between the electrical contact and the voltage terminal; and
the fuse is configured to be burned to decrease capacitance of the ESD protection unit.

3. The semiconductor chip of claim 1, wherein the ESD protection element comprises a diode.

4. A semiconductor device comprising:
a first semiconductor chip comprising:
a first electrical contact;
a first application circuit configured to perform operations according to at least a signal received by the first electrical contact; and
a first electrostatic discharge (ESD) protection unit coupled to the first electrical contact; and
a second semiconductor chip comprising:
a second electrical contact;
a second application circuit configured to perform operations according to at least a signal received by the second electrical contact; and
a second ESD protection unit coupled to the second electrical contact;
wherein:
the first electrical contact is coupled to the second electrical contact for receiving a same signal;
capacitance of the first ESD protection unit is adjustable; and
capacitance of the second ESD protection unit is adjustable.

5. The semiconductor device of claim 4, wherein the first ESD protection unit comprises:
a first ESD protection element coupled between the first electrical contact and a voltage terminal, and having first capacitance; and
a second ESD protection element coupled between the first electrical contact and the voltage terminal, and having second capacitance;
wherein the voltage terminal is coupled to a ground or a power voltage.

6. The semiconductor device of claim 5, wherein:
the first ESD protection unit further comprises a switch coupled in series with the second ESD protection element between the first electrical contact and the voltage terminal; and
the first semiconductor chip further comprises a control circuit configured to turn on or turn off the switch for adjusting capacitance of the first ESD protection unit.

7. The semiconductor device of claim 5, wherein:
the first ESD protection unit further comprises a fuse coupled in series with the second ESD protection element between the first electrical contact and the voltage terminal; and
the fuse is configured to be burned to decrease capacitance of the first ESD protection unit.

8. The semiconductor device of claim 5, wherein the first ESD protection element comprises a diode.

9. The semiconductor device of claim 4, wherein the first application circuit of the first semiconductor chip and the second application circuit of the second semiconductor chip are dynamic random access memory (DRAM) circuits.

10. The semiconductor device of claim 4, further comprising a substrate, wherein the first semiconductor chip is disposed on the substrate, and the second semiconductor chip is stacked on the first semiconductor chip.

11. The semiconductor device of claim 4, further comprising a substrate, wherein the first semiconductor chip is disposed on a first surface of the substrate, and the second semiconductor chip is disposed on a second surface of the substrate.

12. The semiconductor device of claim 4, wherein the first semiconductor chip further comprises:
a third electrical contact configured to receive a first semiconductor chip selection signal; and
a third ESD protection unit coupled between the third electrical contact and a voltage terminal;
wherein capacitance of the third ESD protection unit is not adjustable.

13. The semiconductor device of claim 12, wherein the second semiconductor chip further comprises:
a fourth electrical contact configured to receive a second semiconductor chip selection signal different from the first semiconductor chip selection signal; and
a fourth ESD protection unit coupled between the fourth electrical contact and the voltage terminal;
wherein capacitance of the fourth ESD protection unit is not adjustable.

14. An electrostatic discharge (ESD) protection method for a semiconductor device, the semiconductor device comprising a first semiconductor chip and a second semiconductor chip, the first semiconductor chip comprising a first electrical contact, the second semiconductor chip comprising a second electrical contact, and the method comprising:
forming a first ESD protection unit in the first semiconductor chip, wherein the first ESD protection unit is coupled to the first electrical contact;

forming a second ESD protection unit in the second semiconductor chip, wherein the second ESD protection unit is coupled to the second electrical contact;

coupling the first electrical contact to the second electrical contact; and adjusting capacitance of the first ESD protection unit and capacitance of the second ESD protection unit.

15. The method of claim 14, wherein the first ESD protection unit comprises a plurality of ESD protection elements coupled between the first electrical contact and a voltage terminal, the voltage terminal is coupled to a ground or a power voltage, and adjusting the capacitance of the first ESD protection unit and the capacitance of the second ESD protection unit comprises:

uncoupling at least one of the plurality of ESD protection elements from the first electrical contact or the voltage terminal.

16. The method of claim 14, wherein the semiconductor device further comprises at least one semiconductor chip having a same structure as the first semiconductor chip and comprising an electrical contact coupled to the first electrical contact of the first semiconductor chip, and the method further comprises:

determining targeted capacitance of the first ESD protection unit and the second ESD protection unit according to a total quantity of semiconductor chips including the first semiconductor chip, the second semiconductor chip, and the at least one semiconductor chip in the semiconductor device.

17. The method of claim 14, wherein each of the first semiconductor chip and the second semiconductor chip comprises dynamic random access memory circuit.

18. The method of claim 14, wherein the semiconductor device further comprises a substrate, the first semiconductor chip is disposed on the substrate, and the second semiconductor chip is stacked on the first semiconductor chip.

* * * * *